(12) United States Patent
Cerofolini et al.

(10) Patent No.: US 6,890,806 B2
(45) Date of Patent: May 10, 2005

(54) SEMICONDUCTOR INTEGRATED ELECTRONIC DEVICE AND CORRESPONDING MANUFACTURING METHOD

(75) Inventors: Gianfranco Cerofolini, Milan (IT); Giuseppe Ferla, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/763,626

(22) Filed: Jan. 23, 2004

(65) Prior Publication Data

US 2004/0152249 A1 Aug. 5, 2004

Related U.S. Application Data

(62) Division of application No. 10/199,964, filed on Jul. 18, 2002, now Pat. No. 6,724,009.

(30) Foreign Application Priority Data

Jul. 19, 2001 (EP) .............................. 01830486
Nov. 23, 2001 (EP) ............................. 01127923

(51) Int. Cl.⁷ ....................................... H01L 21/8234
(52) U.S. Cl. ..................... 438/197; 438/99; 438/287; 438/591
(58) Field of Search .................... 438/197, 99, 198, 438/216, 260, 261, 287, 591, 780

(56) References Cited

U.S. PATENT DOCUMENTS

| | | | |
|---|---|---|---|
| 5,543,356 A | 8/1996 | Murakami et al. | 438/548 |
| 6,342,716 B1 * | 1/2002 | Morita et al. | 257/315 |
| 6,794,220 B2 * | 9/2004 | Hirai et al. | 438/99 |
| 2002/0130317 A1 | 9/2002 | Bratkovski et al. | 257/40 |
| 2002/0149809 A1 | 10/2002 | Jackson | 359/107 |
| 2003/0082444 A1 | 5/2003 | Kuhr et al. | 429/149 |
| 2003/0111670 A1 | 6/2003 | Misra et al. | 257/200 |

FOREIGN PATENT DOCUMENTS

| | | |
|---|---|---|
| DE | 100 13 013 A1 | 10/2000 |
| DE | 101 32 640 A1 | 1/2003 |
| WO | WO 00/49643 | 8/2000 |

OTHER PUBLICATIONS

Ellenbogen, J. et al., "Architectures for Molecular Electronic Computers: 1. Logic Structures and an Adder Designed from Molecular Electronic Diodes," in *Proceedings of the IEEE*, New York, Mar. 2000, vol. 88, No. 3, pp. 383–426.

Gittins, D. et al., "A Nanometre–Scale Electronic Switch Consisting of a Metal Cluster and Redox–Addressable Groups," *Nature* 408:67–69, Nov. 2000.

Majumder, et al., Materials Translation: Bipyridinium Molecular Switch, 2001, Japan Institute of Metals, 42(11):2276–2278.

* cited by examiner

*Primary Examiner*—Tuan H. Nguyen
(74) *Attorney, Agent, or Firm*—Lisa K. Jorgenson; Hai Han; Seed IP Law Group PLLC

(57) ABSTRACT

A method of fabricating a MOS transistor with a controllable and modulatable conduction path through a dielectric gate oxide is disclosed, wherein the transistor structure comprises a dielectric oxide layer formed between two silicon plates, and wherein the silicon plates overhang the oxide layer all around to define an undercut having a substantially rectangular cross-sectional shape. The method comprises the steps of: chemically altering the surfaces of the silicon plates to have different functional groups provided in the undercut from those in the remainder of the surfaces; and selectively reacting the functional groups provided in the undercut with an organic molecule having a reversibly reducible center and a molecular length substantially equal to the width of the undercut, thereby to establish a covalent bond to each end of the organic molecule.

20 Claims, 1 Drawing Sheet

SEMICONDUCTOR INTEGRATED ELECTRONIC DEVICE AND CORRESPONDING MANUFACTURING METHOD

CROSS REFERENCE TO RELATED APPLICATIONS

This application is a divisional application of U.S. application Ser. No. 10/199,964 filed Jul. 18, 2002, now U.S. Pat. No. 6,724,009, which claims priority from European Application Nos. 01830486.5 filed Jul. 19, 2001 and 01127923.9 filed Nov. 23, 2001, all three of these applications being incorporated herein by reference in their entireties.

FIELD OF INVENTION

The present invention relates to an electronic device which is integrated in a semiconductor substrate. More particularly, it relates to a structure of an electronic device that can be integrated monolithically in a semiconductor, e.g., a FET (Field-Effect Transistor).

The invention further relates to an integrated memory circuit comprising a plurality of such transistors. The invention is directed to increase the number of memory cells that are integrated in the semiconductor material, and improve the quality of the information that is stored in the memory.

BACKGROUND OF THE INVENTION

Current technologies for fabricating semiconductor integrated devices have led to a large reduction in the circuit area requirements of individual electronic devices. In the case of a FET, this is achieved by progressively reducing the size of the FET active areas that compose the basic blocks of most electronic circuits. Sub-micron size (e.g., 0.18-micron) transistors can be currently obtained, and the scaling-down trend shows no signs that it may end there with the integration process.

All types of semiconductor circuits have benefited from the intensified integration, and especially so integrated memory circuits having non-volatile memory cells, such as EPROM, EEPROM and Flash-EEPROM cells, integrated therein.

There are two types of non-volatile memories which are comprised of floating-gate transistors. The first type is represented by EPROMs and can be programmed electrically and erased optically.

The second type, represented by EEPROMs and Flash-EEPROMs, allows the stored information to be modified electrically for both writing and erasing.

In either cases, the information is recorded in the memory in the form of electric charges that are stored into the floating gates of the transistors.

EEPROMs will be specifically considered here, in which the state of any memory cell, or of the floating-gate transistor comprising the cell, can be altered by causing electrons to flow through a thin layer of silicon oxide by tunnel effect.

DESCRIPTION OF THE RELATED ART

It is well known to the skilled persons in the art that EEPROMs exist in two main types, i.e., one type having a single polysilicon level provided to form the floating gate region, and another type having two discrete polysilicon levels provided to also form a control gate region. This distinction is, however, irrelevant to this invention.

The individual non-volatile EEPROM cell comprises a FET or a MOSFET transistor having a drain region and a source region. These regions are integrated in a semiconductor substrate and isolated from each other by a substrate portion known as the channel region. A floating gate region is formed above the substrate and is separated from the latter by a thin layer of a dielectric oxide known as the tunnel oxide.

When the conduction channel of the floating-gate transistor is put in a saturated state, the agitation of the hot carriers (consisting of electrons when the channel is of the N type) releases sufficient energy for them to flow past the barrier formed by the tunnel oxide between the conduction channel and the floating gate. The hot carriers then become trapped within the floating gate.

With a sufficiently high program voltage, the electrons trapped in the floating gate will be unable to leave it, although they keep being agitated. However, this agitation produces inadequate energy for them to get out of the floating gate. As a result, these electrons block the conduction channel with an electric field.

To erase the cell, a high voltage is applied to the drains and sources of the floating-gate transistors, with the floating gate held at a zero potential. Under such conditions, a powerful reverse electric field is created in the transistor, which causes the trapped carriers to migrate toward the drain or the source electrode.

It can be appreciated from the foregoing that, for the purpose of an intensified integration, any reduction in size of these memory cells goes forcibly through a reduction of the coupling surfaces between the floating gates and the conduction channels of the floating-gate transistors. This reduction of the coupling surfaces alters the conditions for conduction by the transistor channel so deeply that the thickness of the tunnel oxide also has to be reduced, down to less than 80 Ångströms (1 Ångström=0.1 nm).

The thickness of the tunnel oxide turns out to be very difficult to reduce for two reasons. On the one hand, with the decrease of thickness, fault density is bound to increase and the rate of product acceptance decrease. On the other hand, charge (or electron) retention in the floating gates diminishes with reduction in thickness.

In reality, due to their agitation, the electrons do flow at least to some degree past the barrier created by the thick gate oxide. As a result, the information stored in a memory location will vanish gradually. It is presently estimated to practically disappear over a 10-year period. If the tunnel oxide were provided at a thinner dimension, this retention time would be greatly shortened.

In order to reduce the dimension of the thin layer of tunnel oxide while retaining its primary dielectric function, other migrating mechanism has been considered whereby the electrons flow along a conduction path other than the dielectric oxide barrier, and become trapped in the floating gate region. For example, as pointed out by D. I. Gittins et al., *Nature*, 11.02.2000, vol. 408, pages 67–69, there exist organic molecules that contain redox centers, i.e., chemical species whose oxidation number (and hence, electron structure) can be modified reversibly. These molecules support a so-called resonant tunneling, and perform promisingly when provided as molecular layers between electric contacts. However, their integration to more complex structures still poses some problems.

Exemplary of such molecules are compounds that contain a reversibly reducible bipyridinium group centrally located, e.g., N,N-di-(10-mercaptodecyl)-4,4'-bipyridinium dibromide.

These compounds usually contain terminal thiol groups in order for them to become bonded to the gold of electrodes used for electrical measuring purposes.

Since it would be extremely difficult to provide gold electrodes in the form of parallel plates spaced one molecule-length (approximately 3 nm) apart, the above molecules are tested by bonding them with one end to one electrode and with the other end to a gold nano-particle (measuring about 6 nm in diameter) that, in turn, is used as a contact of a scanning tunneling microscope operated in an electric-probe mode.

While the above-outlined arrangement is useful as far as determining the electrical characteristics of the molecules and controlling the conduction mechanisms and paths (tunneling, resonant tunneling, etc.) is concerned, it is incompatible with silicon-integrated circuits.

Accordingly, there exists in the art a need for methods of integrating molecular layers to conventional silicon-based microelectronic structures and enabling them to function as carriers of electrically charged particles. The present invention satisfies this need and provides further related advantages.

BRIEF SUMMARY OF THE INVENTION

One aspect of the present invention is to provide a hybrid configuration in which organic molecules are bonded to conventional silicon-based microelectronic structures and enabling them to function as carriers of electrically charged particles. It was found that the basic component of nearly all integrated electronic circuits, i.e., the MOS or the MOSFET transistor, would meet the requirement of receiving said molecules.

In one embodiment, the present invention is related to a method of controlling and modulating the charge flow through a dielectric oxide of a MOS transistor, wherein the transistor structure comprises a layer of silicon oxide (gate oxide) formed between two silicon plates, with the plates overhanging the silicon oxide layer all around to define an undercut having a substantially rectangular cross-sectional shape and a height of about 3 nm, said method comprising the steps of:

chemically altering the surfaces of said silicon plates to have different functional groups in said undercut from those in the remainder of the surfaces; and selectively reacting said functional groups located at the undercut with an organic molecule so as to establish a covalent bond to each of the molecule ends, said molecule containing a reversibly reducible center and having a molecular length of about 3 nm.

said organic molecule has the formula $R_1$—Y—$R_1$, wherein,

Y is a redox center having the following formula:

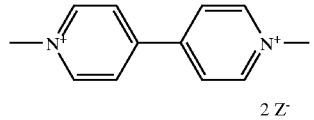

2 Z⁻

$R_1$ is a —$CH_2$—$(CHR_2)_n$—$R_3$ chain, wherein n=6–8;
$R_2$ is H or $C_1$–$C_6$ alkyl group;
$R_3$ is selected from a group consisting of —$CH_2$—$CH_2$—X, —CH=$CH_2$, —C≡CH, and C≡N, wherein X is either —SH or —$SiH_2Cl$; and
$Z^-$ is a monovalent anion.

In another embodiment, the instant invention is related to a transistor structure comprising a layer of dielectric silicon oxide formed between two silicon plates, wherein said plates overhang said oxide layer all around to define an undercut having a substantially rectangular cross-sectional shape and a preset height, and wherein the surfaces of said plates at said undercut have different functional groups from those in the other surfaces.

The features and advantages of the method according to the invention will be apparent from the following description of an embodiment thereof, given by way of example and not of limitation with reference to the accompanying drawings.

DETAILED DESCRIPTION OF THE INVENTION

This description refers to a storage circuit application for convenience of illustration only, it is possible for the invention to be applied to integrated circuits of any kind that incorporate field-effect transistors.

As mentioned above, one aspect of the present invention is to provides a hybrid configuration in which organic molecules are bonded to conventional silicon-based microelectronic structures. It was found that the basic component of nearly all integrated electronic circuits, i.e., the MOS or the MOSFET transistor, are suitable to receive said molecules.

Figure 1:
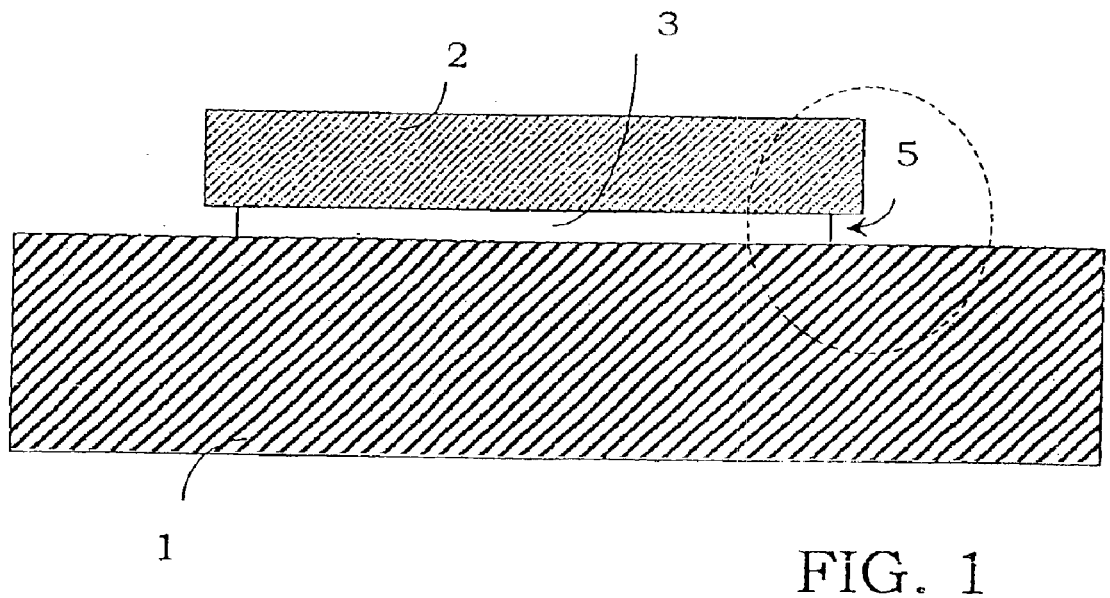
FIG. 1 shows schematically a structure of a conventional MOS transistor.

A MOS transistor, of which FIG. 1 is only an enlarged partial view, is characterized by a structure with parallel layers consisting of a bottom silicon layer 1 and a top silicon layer 2 that are separated by a dielectric oxide layer 3, forming the gate oxide and being about 3 nm thick with the current technology. Layer 1 may be a semiconductor substrate, and layer 2 may be polysilicon.

As shown in the drawing, the polysilicon layer 2 overhangs the dielectric oxide layer 3 all around, thereby defining an undercut in cooperation with the substrate 1.

Thus, an undercut 5 of substantially rectangular cross-sectional shape is formed between the peripheral edge of the polysilicon top layer 2 and the substrate 1. It has been thought that the aforementioned organic molecules could fit in this undercut, whose height is controlled by the gate oxidation process to vary between 2 and 100 Ångströms. The layers 1 and 2 will also be referred to as the plates hereinafter.

Figure 2:
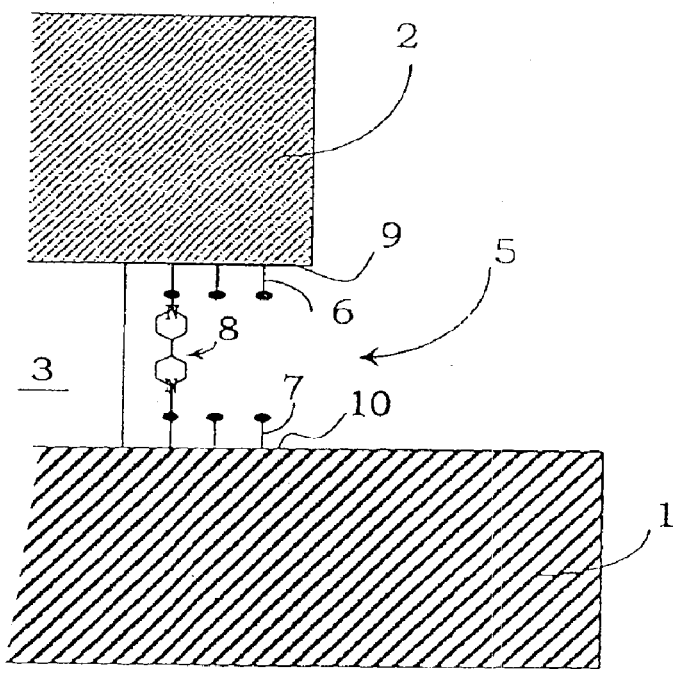
FIG. 2 is an enlarged detail view of the structure shown in FIG. 1 as embodying this invention.

The molecules should be anchored with one end in the bottom surface 9 of the top silicon layer 2 (polysilicon) and with the other end in the top surface 10 of the bottom silicon layer 1 (the substrate), as in the even more enlarged view of FIG. 2.

For the molecules to become anchored, said surfaces should include suitable functional groups to bond to the terminating groups of the molecules. The terminating functional groups of the molecules should be prevented from reacting with functional groups in the silicon plate surfaces that lie outside the undercut 5, for otherwise, the molecules would fail to bridge the gap between the plates and function as expected.

Accordingly, the surfaces of the silicon plates 1 and 2 are chemically altered at the undercut 5 to provide them with functional groups 6, 7 selected from a group that consists of —H, —OH, —Au, and $NH_tR(2-_t)$, where R is a lower alkyl group, preferably $C_1$–$C_4$, and t is 0, 1, or 2.

Thus, one aspect of the present invention involves a method of controlling and modulating the charge flow through a dielectric oxide of a MOS transistor, wherein the transistor structure comprises a layer of silicon oxide (gate oxide) formed between two silicon plates, with the plates overhanging the silicon oxide layer all around to define an undercut having a substantially rectangular cross-sectional shape and a height of about 3 nm, said method comprises the steps of:

chemically altering the surfaces of said silicon plates to have different functional groups in said undercut from those in the remainder of the surfaces; and selectively reacting said functional groups located at the undercut with an organic molecule so as to establish a covalent bond to each of the molecule ends, said molecule containing a reversibly reducible center and having a molecular length of about 3 nm.

said organic molecule has the formula $R_1$—Y—$R_1$, wherein,

Y is a redox center having the following formula:

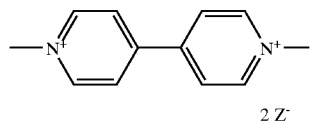

2 Z⁻

$R_1$ is a —$CH_2$—$(CHR_2)_n$—$R_3$ chain, wherein n=6–8;
$R_2$ is H or $C_1$-$C_6$ alkyl group;
$R_3$ is selected from a group consisting of —$CH_2$—$CH_2$—X, —CH=$CH_2$, —C≡CH, and C≡N, wherein X is either —SH or —$SiH_2$Cl; and
Z⁻ is a monovalent anion.

In a preferred embodiment, n=7, and more preferred are molecules in which $R_2$ is H, Z is Br⁻, Cl⁻, F⁻, I⁻ or $PF_6^-$, and $R_3$ is —CH=$CH_2$, —C≡CH, or —$CH_2$—$CH_2$—$SiH_2$Cl.

Molecules in which n=7, $R_2$ is H, Z⁻ is Br⁻, and $R_3$ is —$CH_2$—$CH_2$—$SiH_2$Cl, —CH=$CH_2$ or —C≡CH are most preferred.

The reaction of the functional groups 6, 7 in the surfaces of the silicon plates 1, 2 that define the undercut 5 with an organic molecule 8 of the kind previously described occurs according to one of the following pathways:

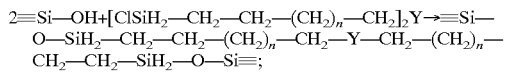

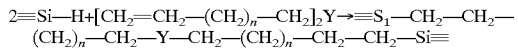

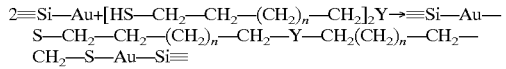

wherein, ≡Si is the silicon in the surfaces of plates 1, 2, and n and Y have the same meanings as specified above.

The first reaction is widely carried out to substitute —$OCH_3$ groups for the —OH terminations of glass object surfaces in order to make the glass surface hydrophobic that was originally hydrophilic. Such terminations have been used as stoppers in rotaxanes (B. Munn, *The New Chemistry*, ed. N. Hall (Cambridge University Press, Cambridge), 2000, page 375).

The second reaction requires external activation (G. P. Lopinski, D. D. M. Wayner, R. A. Wolkow, *Nature*, 2000, 406, 48) or a catalyst (F. A. Cotton, G. Wilkinson, *Advanced Inorganic Chemistry*, 5th Ed., 1988, Wiley, N.Y., page 1255), in the instance of the molecules being short-chained, but takes place spontaneously in the instance of molecules that, like those used in this invention, have a chain of at least 10 carbon atoms.

Process steps, by which the required transistor structure to implement the method of this invention can be obtained, will now be described in detail.

It is recognized that when the silicon plates in the structure of a MOS transistor are subjected to an etching sequence comprising a first plasma etching step, followed by a wet etching step using aqueous HF, the silicon surfaces emerge from a rinsing step with mixed up $SiH_m(OH)_{n-m}$ terminations, where n≦3 and m≦n (M. Niwano, J. Kageyama, K. Kinashi, I. Takasashi, and N. Miyamoto, *J. Appl. Phys.*, 76, 1994, page 2157).

To have the organic molecules anchor themselves as desired in the silicon surface, the terminations in the silicon surface need be controlled.

To obtain surfaces with terminations that are all of the —OH type, wet processing under oxidizing conditions, e.g., treating with $H_2SO_4$:$H_2O_2$ followed by rinsing with water, can be adopted. This process would leave the silicon surface covered with a highly hydroxylated oxide about the thickness of a single layer.

To obtain surfaces with terminations that are all of the —H type, the native oxide obtained by treating with an aqueous solution of HF may be exposed to a hydrogen atmosphere at moderate temperature for a suitably long time. For example, exposure to $H_2$ under 30 Pa, at 700° C. for 20 minutes, will reduce the amount of oxygen to less than $10^{-2}$-single layer (T. Ayoama, K. Goto, T. Yamazaki, and T. Ito, *J. Vac. Sci. Technol.*, A 14, 1996, page 2909).

The resultant hydrogen-terminated surface is relatively stable, since exposure to air for $10^4$ s reveals no appreciable oxidation of the silicon (G. F. Cerofolini, M. Camalleri, C. Galati, S. Lorenti, L. Renna, O. Viscuso, G. G. Condorelli, and I. L. Fragalà, *Appl. Phys. Lett.* 79, 2001, page 2378).

As said before, the organic molecule should only anchor itself in the undercut region, not all over the surfaces of the individual silicon plates. Accordingly, the undercut region alone must be provided with suitable terminations for bonding to the molecule.

To achieve this, it has been thought of resorting to anisotropic cathodic sputtering in combination with isotropic wet etching.

The silicon surface of the above MOS transistor structure provided with the undercut is first plasma etched to remove the resist, and then isotropically wet etched using aqueous HF.

At this stage, different procedures will be followed as dictated by the terminating functional groups of the organic molecule that must be bonded in the undercut.

In the instance of molecules that have alkenyl or alkynyl terminations, hydrogen terminations should be provided in the surfaces of the undercut region, and oxygenated terminations in the remaining surfaces of the transistor structure.

In this case, the process comprises the following steps:

1) exposing the whole structure to hydrogen, at a high temperature (at least 600° C.), e.g., at 700° C., under 30 Pa for 20 minutes, so as to cleave all of the —OH terminations and produce a thoroughly hydrogenated surface (see Aoyama et al., above);

2) removing, by anisotropic sputtering, the hydrogen from the surfaces outside the undercut;

3) exposing to air, to oxidize the silicon in the sputtered area; and 4) exposing the transistor structure to a solution of the organic molecule having alkenyl or alkynyl terminating functional groups.

On the other hand, where an organic molecule with chlorosilyl terminating groups is used, hydroxyl terminations should be provided in the surfaces of the undercut region, and hydrogen terminations in the other surfaces.

In this case, the process would include the following steps:

1) oxidizing under $O_2$ at a higher temperature than 600° C., e.g., at 800° C., until an oxide thickness same as a single layer is obtained;

2) removing, by anisotropic sputtering, the oxygen from the surfaces outside the undercut;

3) exposing to hydrogen at a high temperature of at least 600° C. (exposing at 700° C. under $10^{-2}$ Pa produces hydrogen terminations in the surfaces outside the undercut, and cleaves the siloxane bridges to form hydroxyl terminations in the surfaces of the undercut region (see Aoyama et al., above)); and 4) exposing to a solution of the organic molecule having chlorosilyl terminating functional groups.

To summarize, the invention teaches fabricating a semiconductor electronic device, specifically a FET or a MOSFET, in which an organic molecule is firmly anchored between two opposite surfaces of an undercut provided between two parallel plates 1, 2 of a conductive material (monocrystalline and polycrystalline silicon), with the plates being separated by a layer 3 of dielectric oxide, e.g., a gate oxide or a tunnel oxide. The organic molecule 8 can be excited electrically as a Schmitt trigger by applying an electric potential thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of fabricating a MOS transistor with a controllable and modulatable conduction path through a dielectric oxide layer, said transistor structure comprising said dielectric oxide layer formed between two silicon plates having surfaces, wherein, said silicon plates overhang said dielectric oxide layer all around to define an undercut having a substantially rectangular cross-sectional shape, said method comprising the steps of:

chemically altering respective surfaces of said silicon plates defining said undercut to provide at said undercut first functional groups;

chemically altering respective surfaces of said silicon plates outside of said undercut to provide second functional groups; and selectively reacting said first functional groups provided at said undercut with an organic molecule having ends and a reversibly reducible center, thereby establishing a covalent bond to each end of said organic molecule.

2. A method according to claim 1 wherein said organic molecule has formula $R_1$—Y—$R_1$, wherein, Y is a redox center having the following formula:

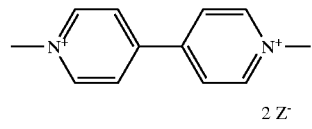

$R_1$ is a —$CH_2$—$(CHR_2)_n$—$R_3$ chain, wherein n=6–8;

$R_2$ is H or $C_1$–$C_6$ alkyl group;

$R_3$ is selected from the group consisting of —$CH_2$—$CH_2$—X, —CH=$CH_2$, —C≡CH, and C≡N, wherein X is either —SH or —$SiH_2$Cl; and $Z^-$ is a monovalent anion.

3. A method according to claim 2, wherein, n=7 in said organic molecule.

4. A method according to claim 3, wherein, $R_2$=H, $Z^-$=$Br^-$, $Cl^-$, $F^-$, $I^-$ or $PF_6^-$, and $R_3$=—CH=$CH_2$, —C≡CH or —$CH_2$—$CH_2$—$SiH_2$Cl in said organic molecule.

5. A method according to claim 4, wherein, $Z^-$=$Br^-$, and $R_3$=—$CH_2$—$CH_2$—$SiH_2$Cl or —CH=$CH_2$ or —C≡CH in said organic molecule.

6. A method according to claim 2 wherein the surfaces of said silicon plates in said undercut are chemically altered to have functional groups selected from the group consisting of —H, —OH, —Au, and —$NH_tR(2-t)$, wherein, R is lower alkyl and t=0, 1, or 2.

7. A method according to claim 6 wherein the surfaces of said silicon plates in said undercut are chemically altered to have —H functional groups, whereas said surfaces outside said undercut have —OH functional groups, and wherein $R_3$=—CH=$CH_2$ or —C≡CH in said organic molecule, said method comprising the steps of:

exposing the surfaces of said plates, as previously conventionally plasma etched and isotropically etched with aqueous HF, to hydrogen at a high temperature for a sufficiently long time to cleave all of the —OH terminations and hydrogenate the surfaces throughout;

anisotropically sputtering said plates to remove the hydrogen from the surfaces outside the undercut;

exposing said plates to air; and exposing said plates to a solution of said organic molecule.

8. A method according to claim 6 wherein the surfaces of said silicon plates in said undercut are chemically altered to have —OH functional groups, whereas said surfaces outside said undercut have —H functional groups, and wherein $R_3$=—$CH_2$—$CH_2$—$SiH_2$Cl in said organic molecule, said method comprising the steps of:

exposing the surfaces of said plates, as previously conventionally plasma etched and isotropically etched with aqueous HF, to oxidation under $O_2$ at a high temperature until oxide as thick as a single layer is obtained;

anisotropically sputtering said plates to remove the oxygen from the surfaces outside the undercut;

exposing said plates to hydrogen at a high temperature for a sufficiently long time to form hydrogen terminations in the surfaces outside the undercut and form hydroxyl terminations in the surfaces of the undercut region; and exposing said plates to a solution of said organic molecule.

9. The method according to claim 1 wherein the molecular length of said organic molecule substantially equals to a height measured by a distance between said silicon plates.

10. The method according to claim 9 wherein said organic molecule is about 3 nm in length.

11. A method of fabricating a MOS transistor with a controllable and modulatable conductive path through a dielectric oxide layer, said transistor structure comprising said dielectric oxide layer formed between two silicon plates having surfaces, wherein, said silicon plates overhang said dielectric oxide layer all around to define an undercut having a substantially rectangular cross-sectional shape, said method comprising:

provided —H functional groups on respective surfaces of said silicon plates defining said undercut;

providing —OH functional groups on respective surfaces of said silicon plates outside of said undercut;

selectively reacting said —H functional groups provided at said undercut with an organic molecule having ends and a reversibly reducible center, thereby establishing a covalent bond to each end of said organic molecule.

12. The method according to claim 11 wherein said steps of providing said —H and —OH functional groups on the surfaces of said silicon plates comprises:

isotropically etching the surfaces of said silicon plates with aqueous HF;

exposing the surfaces of said silicon plates to hydrogen at a high temperature for a sufficiently long time to hydrogenate the surfaces of said silicon plates throughout;

anisotropically sputtering said silicon plates to remove the hydrogen from the surfaces outside of said undercut;

exposing said plates to air; and exposing said plates to a solution of said organic molecule.

13. The method according to claim 11 wherein said organic molecule has formula $R_1$—Y—$R_1$, wherein, Y is a redox center having the following formula:

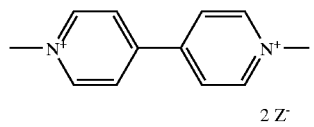

2 Z⁻

$R_1$ is a —CH$_2$—(CHR$_2$)$_n$—$R_3$ chain, wherein n=6–8;
$R_2$ is H or $C_1$-$C_6$ alkyl group;
$R_3$ is —CH=CH$_2$ or —C≡CH;
Z⁻ is a monovalent anion.

14. The method according to claim 11 wherein the molecular length of said organic molecule substantially equals to a height measured by a distance between said silicon plates.

15. The method according to claim 14 wherein said organic molecule is about 3 nm in length.

16. A method of fabricating a MOS transistor with a controllable and modulatable conductive path through a dielectric oxide layer, said transistor structure comprising said dielectric oxide layer formed between two silicon plates having surfaces, wherein, said silicon plates overhang said oxide layer all around to define an undercut having a substantially rectangular cross-sectional shape, said method comprising the steps of:

providing —OH functional groups on respective surfaces of said silicon plates defining said undercut;

providing —H functional groups on respective surfaces of said silicon plates outside of said undercut;

selectively reacting said —OH functional groups provided at said undercut with an organic molecule having ends and a reversibly reducible center, thereby establishing a covalent bond to each end of said organic molecule.

17. The method according to claim 16 wherein said steps of providing said —H and —OH functional groups on the surfaces of said silicon plates comprise:

isotropically etching the surfaces of said silicon plates with aqueous HF;

exposing the surfaces of said silicon plates to oxidation under O$_2$ at a high temperature until oxide as thick as a single layer is obtained;

anisotropically sputtering said silicon plates to remove the oxygen from the surfaces outside the undercut;

exposing said plates to hydrogen at a high temperature for a sufficiently long time to form —H functional groups on the surfaces outside the undercut and form —OH functional groups on the surfaces of the undercut region; and exposing said plates to a solution of said organic molecule.

18. The method according to claim 17 wherein the organic molecule has formula $R_1$—Y—$R_1$, wherein, Y is a redox center having the following formula:

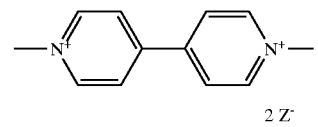

2 Z⁻

$R_1$ is a —CH$_2$—(CHR$_2$)$_n$—$R_3$ chain, wherein n=6–8;
$R_2$ is H or $C_1$-$C_6$ alkyl group;
$R_3$ is —CH$_2$CH$_2$—SiH$_2$Cl;
Z⁻ is a monovalent anion.

19. The method according to claim 16 wherein the molecular length of said organic molecule substantially equals to a height measured by a distance between said silicon plates.

20. The method according to claim 19 wherein said organic molecule is about 3 nm in length.

* * * * *